United States Patent [19]

Iida et al.

[11] 4,356,223
[45] Oct. 26, 1982

[54] SEMICONDUCTOR DEVICE HAVING A REGISTRATION MARK FOR USE IN AN EXPOSURE TECHNIQUE FOR MICRO-FINE WORKING

[75] Inventors: Yasuo Iida; Katumi Suzuki; Nobuhiro Endo, all of Tokyo, Japan

[73] Assignee: Nippon Electric Co., Ltd., Tokyo, Japan

[21] Appl. No.: 237,049

[22] Filed: Feb. 23, 1981

[30] Foreign Application Priority Data

Feb. 28, 1980 [JP] Japan ................................ 55-24830
May 29, 1980 [JP] Japan ................................ 55-71758

[51] Int. Cl.³ .......................... B32B 3/00; G01B 11/00
[52] U.S. Cl. .................................. 428/156; 33/180 R; 33/286; 356/401; 430/22; 156/662
[58] Field of Search ............................. 430/22; 356/401; 33/180 R, 184.5, 286, 293, 297; 428/156; 156/662

[56] References Cited

U.S. PATENT DOCUMENTS

| | | | |
|---|---|---|---|
| 3,461,566 | 8/1969 | Gerstner | 430/22 |
| 3,783,520 | 1/1974 | King | 430/22 |
| 3,969,489 | 6/1976 | Cho | 430/22 |
| 3,990,798 | 11/1976 | White | 356/401 |
| 4,015,034 | 3/1977 | Smolen | 430/22 |
| 4,202,627 | 5/1980 | Suzki et al. | 356/401 |
| 4,309,813 | 1/1982 | Hull | 356/401 |

*Primary Examiner*—William R. Dixon, Jr.
*Attorney, Agent, or Firm*—Sughrue, Mion, Zinn, Macpeak & Seas

[57] ABSTRACT

A registration mark to be used for a micro-fine working technique such as LSI's includes a smaller protrusion pattern within a larger recess pattern formed in a surface of the semiconductor substrate. The recess and protrusion patterns are used for coarse and fine positioning, respectively. The protrusion pattern implements precise positioning because it is isolated from other regions.

19 Claims, 26 Drawing Figures

U.S. Patent    Oct. 26, 1982    Sheet 1 of 4    4,356,223
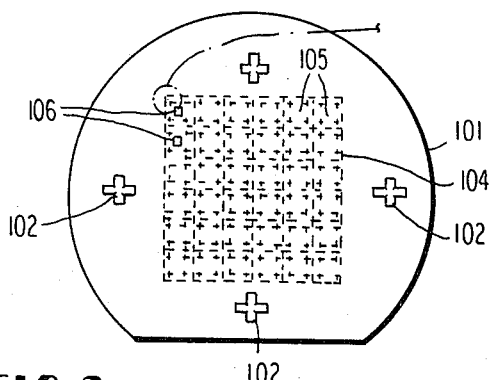
FIG. 1
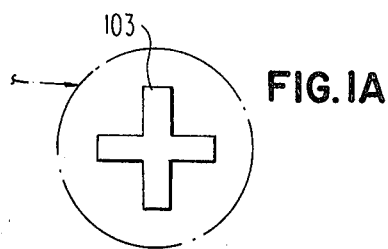
FIG. 1A
FIG. 2
(PRIOR ART)
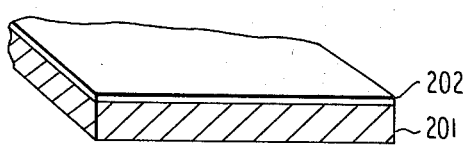
FIG. 3
(PRIOR ART)
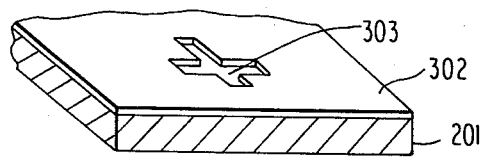
FIG. 4
(PRIOR ART)
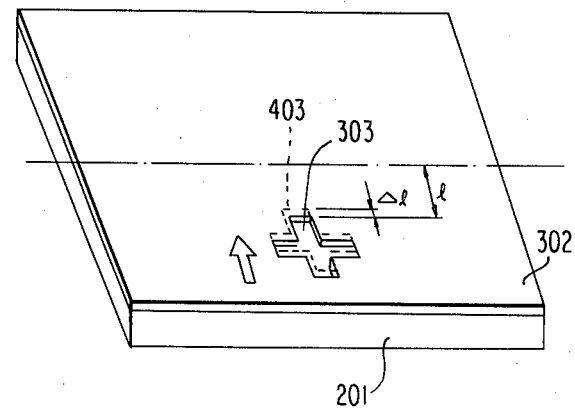
FIG. 5
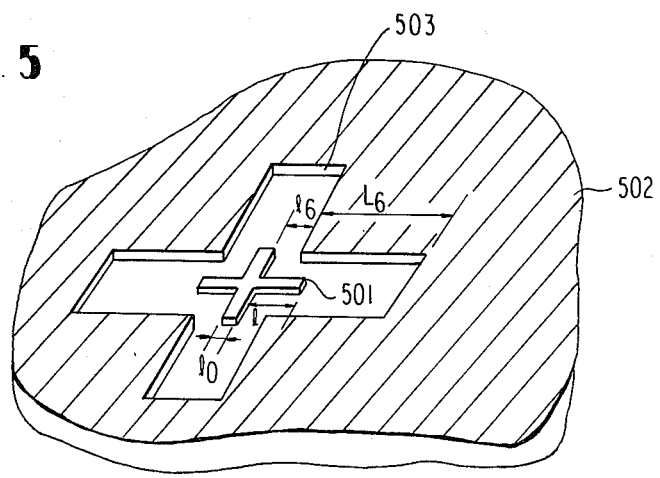

SEMICONDUCTOR DEVICE HAVING A REGISTRATION MARK FOR USE IN AN EXPOSURE TECHNIQUE FOR MICRO-FINE WORKING

BACKGROUND OF THE INVENTION

The present invention relates to a semiconductor device, and more particularly to a semiconductor device or a semiconductor wafer including a plurality of the semiconductor devices having a registration mark for use in automatic registration through an electron beam direct exposure process. The registration mark is used for performing at least a part of a micro-fine working technique in the manufacture of semiconductor devices in which a registering operation is automated, or in combination with an optical exposure process.

In a lithographic technique for manufacturing semiconductor devices, to practically utilize an electron beam direct exposure process it is necessary to precisely detect positions of a wafer and semiconductor chips, which are provided in the wafer and used as semiconductor devices, reinserted into an exposure system each time during successive manufacturing steps and to achieve registration with the already exposed pattern automatically at a high precision in a short period of time. Normally, in order to detect positions of a wafer and semiconductor chips, a method has been practiced, in which a protrusion or a groove of a silicon or silicon oxide film is preliminarily formed on the wafer to be used as a registration mark and this mark is detected by scanning with an electron beam or a laser beam. Such registration marks are very important in manufacturing semiconductor devices through an electron beam direct exposure process only or through an electron beam direct exposure process and an optical exposure process in combination.

Generally, in order to achieve high precision registration, as is essential in an electron beam direct exposure process, corresponding conditions must be satisfied such that edge portions of a registration mark should be smooth, the mark should be precisely positioned, and so on. These conditions serve as a great barrier in practically utilizing the process, and therefore, this process has not yet been established as a mass-production technique. However, generally in view of the smoothness and verticality of the edge portions of the mark, it has been known that use of dry etching is effective for the etching of a silicon or silicon oxide film for use as a registration mark. In addition, it has been believed that in order to increase the precise positioning of the mark it is effective to form a resist layer pattern for use as an etching mark through an electron beam direct exposure process.

With regard to the registration marks necessary for such a process, for example, in addition to registration marks 102 (FIG. 1) for detecting a semiconductor wafer position, which marks are about 10 μm in width and about 100 μm in length and used for coarse registration, semiconductor chip registration marks 103 of about several microns in width and about several tens of microns in length for detecting positions and shapes of chips in order to achieve more precise registration after the coarse registration for the wafer has been effected, are necessary. One or more of these chip registration marks 103, as shown in detail in FIG. 1a are formed on each of a plurality of semiconductor chips (devices) 105 provided on a semiconductor wafer 101 (in the example shown in FIG. 1, four at the corner portions of the periphery of the chip, namely around the device region 106 of the chip 105.) Dash lines 104 indicate boundaries between chips, and normally after the wafer has been scribed along these boundaries to separate the chips, each chip is used as a semiconductor device. As the size of the chip, a rectangle having edge lengths of about 2 mm to about 10 mm is often employed. Accordingly, the area occupied by such registration marks is very small as compared to the region 106 forming a device.

With regard to the registration mark and method for forming the mark in the prior art, the following mark and method have been generally used. At first, a resist 202 is applied on a silicon substrate 201 as shown in FIG. 2. Subsequently, if a positive type of resist has been applied as the resist 202, then the registration mark portion of the resist is exposed to an electron beam in the shape shown at 303 in FIG. 3, but if a negative type of resist has been used, then all of the remaining surface except for the registration mark portion of the resist is exposed to the electron beam. Since the area occupied by the registration mark is very small as compared to the other region as described above, the exposure is easier when the positive type of resist is employed. When the resist is developed after exposure, an opening in the shape of a registration mark portion 303 is formed in the resist layer 302 to expose the surface of the silicon substrate 201. Subsequently, dry etching of the exposed surface portion of the silicon substrate 201 is commenced by employing the resist layer 302 as a mask. However, as the area covered continuously by the resist is large, an influence of changes in properties and an accompanying shrinkage movement of the resist caused by temperature rise of the substrate as well as impacts during the dry etching is so large that various problems occur. Namely, the mark is deformed and the shape and position of the mark 403 which is originally intended to take the shape and position 303 is subjected to displacement in position Δl in proportion to a continuous resist length l as indicated by an arrow in FIG. 4. In the case of the wafer registration mark (normally l is 20 mm to 150 mm), Δl amounts to 2 to 5 μm, and even in the case of the chip registration mark (normally l is 2 mm to 20 mm), Δl is as large as 0.2 to 2 μm. This influence appears more remarkably in the resist for electron beam direct exposure technique than that of optical exposure technique.

Therefore, the adverse effects associated with the change in properties of resist such as deformation and meandering of a pattern, displacement in position of a pattern, etc., are more pronounced as the continuous are of the resist either forming the pattern or being contiguous to the pattern is increased.

In most of the electron beam direct exposure systems, in order to enhance the precision of the aforementioned detection of the wafer position, upon inserting a wafer onto a specimen deck for exposure, coarse positioning is effected visually by means of a microscope. However, this step is desired to be automated. In addition, so far as the currently practiced degree of integration of devices is concerned, there is no need to always depict all the patterns by means of electron beam direct exposure, but in the exposure step not necessitating a high precision it is more advantageous to use in combination an ultraviolet ray exposure process, which is less expensive and faster. On the other hand, in most of the commercially available exposure systems, whether they are electron beam or ultraviolet ray exposure systems, often the designation of the positions of registration marks with respect to a wafer is identical, especially so in an automated device. Moreover, if registration marks for electron beam direct exposure and those for optical exposure are located at different positions, problems arise such that the manipulability upon visual registration is degraded, and means for protecting the registration marks from work processing such as etching or the like in each step becomes complex.

Therefore, taking into consideration the fact that the size of the registration marks required for electron beam direct exposure is extremely small as compared to the size of the registration marks required for optical exposure, the present invention proposes to compound both registration marks.

SUMMARY OF THE INVENTION

It is therefore an object of the present invention to provide a semiconductor device or a semiconductor wafer including a plurality of semiconductor devices having an effective registration mark which is free from the above-mentioned disadvantages in the prior art.

Another object of the invention is to provide a semiconductor device or a semiconductor wafer including a plurality of semiconductor devices having an effective registration mark which can be used both in optical exposure and in electron beam exposure.

Still another object of the present invention is to provide an object to be exposed to electron beam exposure having an effective registration mark which is free from the above-mentioned disadvantages in the prior art.

According to one feature of the invention, there is provided a semiconductor device comprising a semiconductor substrate, a device region, in which many active elements and many passive elements are provided, formed along a major surface of said semiconductor substrate, and a registration mark formed along the major surface and positioned in a peripheral portion around the device portion in the plane view, the registration mark including a protrusion within a recess formed in the major surface of the semiconductor substrate. The recess may form a first registration pattern, the protrusion may form a second registration pattern, and these first and second registration patterns may jointly form a composite registration mark. Moreover, the major surface of the semiconductor substrate may be a semiconductor material per se such as silicon, or may be a dielectric material, formed on a semiconductor material, such as silicon oxide film.

According to yet another feature of the present invention, there is provided a semiconductor wafer comprising a semiconductor substrate, a plurality of semiconductor devices formed along a major surface of the semiconductor substrate in matrix form, and a registration mark formed along the major surface and positioned in a peripheral portion of the matrix form of the semiconductor devices in the plane view, the registration mark including a protrusion within a recess formed in the major surface of the semiconductor substrate. The recess may forms a first registration pattern, the protrusion may forms a second registration pattern, and these first and second registration pattern may jointly form a composite registration mark. Moreover, the major surface of the wafer substrate may be a semiconductor material per se such as silicon, or may be a dielectric material, formed on a semiconductor material, such as silicon oxide film.

According to another aspect of the invention, there is provided an object to be subjected to exposure having a registration mark for use in an exposure technique for micro-fine working. The registration mark comprises two kinds of larger and smaller registration mark patterns superposed on each other, in which the larger pattern is composed of a recess formed on a surface of the object to be exposed and the smaller pattern is composed of a protrusion formed at a partial region within the recess.

According to further another aspect of the invention, there is provided the above-featured registration mark for electron beam exposure, in which a region for forming a registration mark is surrounded by a silicon-removed section so as to isolate the region from a region for forming a main body of a device.

According to yet another aspect of the invention, there is provided the above-featured registration mark for electron beam exposure, in which a recess formed on a silicon surface is in itself used as an isolating region for forming a registration mark, and a silicon protrusion formed within said isolating region as independently patterned in an island shape is used as the registration mark.

According to a still further aspect of the invention, there is provided the above-featured registration mark for electron beam exposure, in which the region for forming a main body of a device and the region for forming a registration mark are isolated from each other by means of a first groove formed in a closed loop, and a second groove formed by removing a part of a silicon surface in the isolating region is used as the registration mark.

In the case of employing the registration mark having the specific structure according to the invention, upon formation of the registration mark, even if an electron beam resist which has a poor resistivity against dry etching is used, etching can be achieved without the influence of the change in properties of the resist during the etching adversely acting upon the precision of the registration pattern, and as a result, a registration mark pattern having an extremely high precision can be formed. Accordingly, when the registration mark is used as a reference for registration also, an advantage can be obtained that registration can be achieved at an extremely high precision.

The thus obtained registration mark for use in an exposure technique for micro-fine working according to the invention, comprises two kinds of larger and smaller registration patterns superposed on each other, and the registration mark is characterized in that the larger pattern is composed of a recess formed on a surface of an object to be exposed and the smaller pattern is composed of a protrusion formed at a partial region within the recess. The outside of the protrusion is preferably not connected to the outer periphery of the recess but is completely isolated therefrom, and if the protrusion should connect through its partial region to the outer periphery of the recess, then a better result would be obtained by making the connecting portion as small as possible to the same extent as being effectively isolated, for example, the connecting portion forms a point contact.

According to the present invention, the larger pattern is used for optical registration where ultraviolet light is employed, and also it is used for coarse registration in the electron beam exposure process. The smaller pattern is used for fine registration in the electron beam exposure process.

With regard to the relative positioning between the two large and small patterns, it is desirable to make the reference points of the respective patterns coincident to each other. However, depending upon the mode of use of the patterns, of course, it is sometimes more favorable that the respective reference points deviate from each other while maintaining a predetermined relationship. Accordingly, in the present invention the relative positioning need not be a fixed relation. As the reference point, for example, a center of rotation of a pattern, a cross point between axes of symmetry, one point on an outer peripheral line, etc., could be used.

In addition, in the case where the outer periphery of the larger pattern and the outer periphery of the smaller pattern jointly coincide at only a particular point (if expressed taking into consideration a thickness, it may have to be said "a particular line"), there is an advantage that the particular relative positioning can be utilized as a measure for detecting an end point of a process such as, for example, a dry etching process that is necessarily practiced in association with the practicing of the present invention. For instance, the mode of utilization is to make decisions such that since the connecting portion is still too thick it will be too early to stop now, or that if a stopping operation is commenced when the connecting portion has been thinned up to a predetermined thickness, then the process will be finished at the state where a point contact has been just made.

BRIEF DESCRIPTION OF THE DRAWINGS

FIG. 1 is a schematic conceptional view for explaining in detail one example of application of the present invention, which shows wafer registration marks and chip registration marks provided on a semiconductor substrate for producing semiconductor devices, FIG. 1A is a more detailed showing of an individual chip registration mark, FIGS. 2, 3 and 4 are schematic views showing successive steps in the process of forming a registration mark having a heretofore known pattern structure for setting forth the problems of such registration marks in the prior art, FIG. 5 is a schematic perspective view showing a first embodiment of the present invention.

DETAILED DESCRIPTION OF PREFERRED EMBODIMENTS

A chip registration mark of the present invention is formed in semiconductor device (chip) and positioned at a peripheral portion adjacent to a device forming region of the semiconductor device where active elements and passive elements are formed. A wafer registration mark of the present invention is formed in a semiconductor wafer and positioned at a peripheral portion adjacent to a region where a plurality of semiconductor devices (chips) are formed in a matrix shape. The registration marks described in the various embodiments can be adapted to the chip registration mark or also to the wafer registration mark.

In FIG. 5 is shown a first embodiment of the present invention in which a smaller pattern 501 of an island shape serving as a protrusion type registration mark for electron beam exposure is disposed in superposition with a larger pattern 503 of the shape of a recess having a depth of 0.5 $\mu$m to 5 $\mu$m from the major surface of the semiconductor substrate 502 serving as a recess type registration mark for optical exposure in such manner that the smaller pattern may be isolated by the larger pattern and the centers of the larger and smaller patterns may coincide with each other. Preferably, a length $L_6$ of the cross arm of the larger pattern and a distance $l_6$ between the smaller pattern and the peripheral wall of the larger pattern should be selected in the ranges of 10 to 200 $\mu$m and 5 to 50 $\mu$m, respectively. With regard to a width $l_0$ of the smaller pattern, a good result can be obtained by selecting it to be 1 to 10 $\mu$m which is about 2 to 10 times as large as a diameter (normally 0.1 to 1 $\mu$m) of an electron beam for scanning the mark. The length l of the arm of the smaller pattern enables automatic scanning if it is selected to be 5 to 50 $\mu$m for a chip registration mark and 50 to 150 $\mu$m for a wafer registration mark. This is determined from the functional requirement that the registration mark must be detected anywhere in the region scanned by an electron beam. However, the length of the arm of the smaller pattern may be made considerably longer without any inconvenience.

Figure 6:
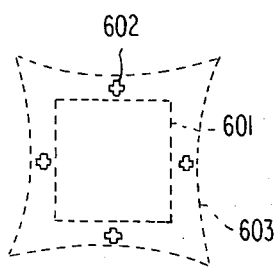
FIG. 6 is a schematic view showing one example of formation of registration marks.

As to the positions where registration mark regions are to be provided on the object to be exposed, preferably they are selected, for example, along the two perpendicular axes of symmetry of a device forming region 601 as shown at 602 in FIG. 6. In the case of the wafer registration marks, they are selected along the two crossed, perpendicular axes of symmetry of a region where a plurality of semiconductor chips (semiconductor devices) are formed as shown in FIG. 1. In the case shown in FIG. 6, the electron beam exposure field takes the shape shown at 603. Generally, among the distortions of the exposure field caused by the electron beam exposure device, a pin cushion distortion is pronouned as shown at 603, and therefore, by disposing the registration mark regions along the two perpendicular axes of symmetry of the device region or chip regions on which the distortion is essentially small, the positions of the registration mark regions are negligibly affected by adjustment errors and aging variations of the distortions to form the registration marks at a high precision, and also a similar advantage can be obtained when the registration marks are used for the purpose of registration, resulting in a high precision of registration.

Figure 7:
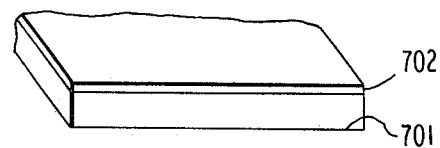
FIGS. 7 to 10 are schematic perspective views showing the successive steps in the process for forming the registration mark according to the first embodiment of the present invention illustrated in FIG. 5.
Figure 8:
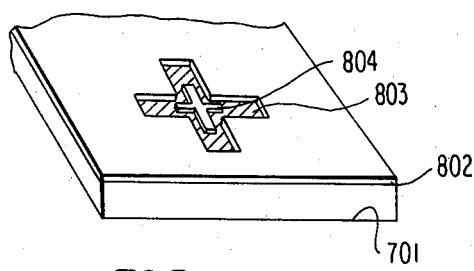
Figure 9:
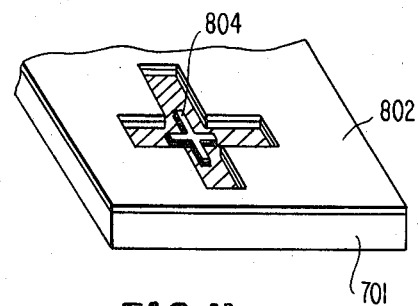
Figure 10:
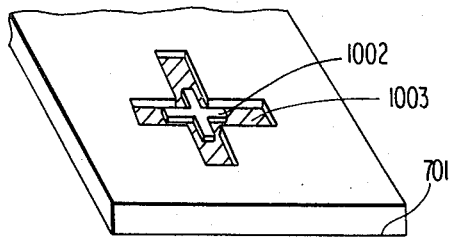

Now description will be made on the process for forming the registration mark shown in FIG. 5. As shown in FIG. 7, on a major surface of a silicon substrate 701 having a thickness of about 150 to 400 μm is applied an electron beam resist 702 such as, for example, AZ-2400 manufactured by Shipley up to a thickness of 0.4 to 4 μm. In this case also, since the proportion of the area of the registration mark with respect to the area of the entire wafer is small, it is favorable to use a positive type resist. Subsequently, as shown in FIG. 8, a portion of a larger pattern 803 is exposed to an electron beam and then developed. Then, dry etching is carried out by making use of the resist pattern formed at a high precision and consisting of a section 804 covering the smaller pattern portion and a section 802 covering the principal surface portion of the silicon substrate, as a mark. For instance, when the exposed surface portion 803 of the silicon substrate 701 is engraved up to a depth of about 0.5 to 5 μm by means of reactive sputter etching within a C Cl$_3$ F atmosphere having a partial pressure of $1 \times 10^{-3}$ to 1 Torr at an RF power of 200 to 600 mW/cm$^2$ for 10 to 100 minutes, a structure shown in FIG. 9 can be obtained. After the resist has been peeled off a resistration mark having both larger and smaller patterns superposed on each other according to the present invention can be obtained, which consists of a larger pattern 1003 having a desired recess and a smaller pattern 1002 having a desired protrusion as shown in FIG. 10. The thus obtained smaller pattern 1002 for use in electron beam exposure registration at the center has a precision in edges of ±0.1 μm or less and a precision in a center position of ±500 Å or less. In this way, according to the present invention, a registration pattern having a high precision can be formed on a substrate.

Figure 11:
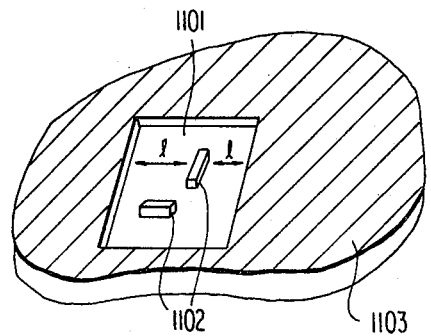
FIG. 11 is a schematic perspective view showing a second embodiment of the present invention.

In FIG. 11 is shown a neighborhood of an isolating region according to a second embodiment of the present invention in the form of a schematic partial perspective view. With reference to FIG. 11, protrusion type registration marks 1102 are formed in an island shape within a recess 1101 formed on a silicon substrate 1103. The depth of the step in the silicon is preferably selected at about 0.5 to 5 μm. A distance l between the registration mark and the surrounding wall which delimits the isolating region is such that when the registration mark is scanned by a beam, the sidewalls have no influence. Generally, the distance l is preferably equal to the sum of the beam scanning distance and about several microns.

Figure 12:
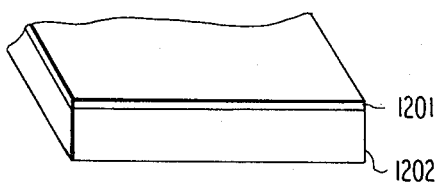
FIGS. 12 to 15 are schematic perspective views showing the successive steps in the process for forming the registration mark according to the second embodiment of the present invention illustrated in FIG. 11.
Figure 13:
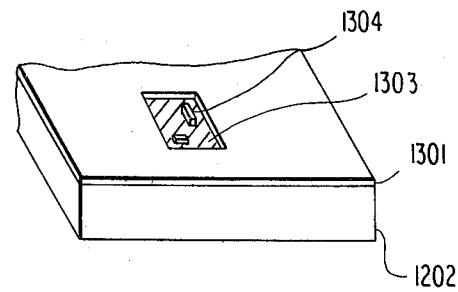
Figure 14:
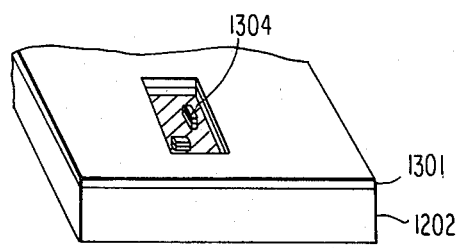
Figure 15:
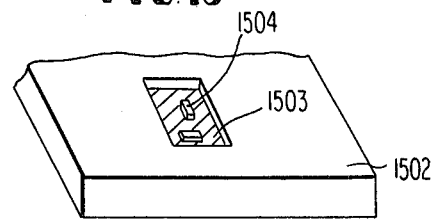

Now description will be made on the process for producing the registration mark according to the second preferred embodiment. As shown in FIG. 12, on a silicon substrate 1202 having a thickness of about 150 to 400 μm is applied electron beam resist 1201. As shown in FIG. 13, exposure is effected in such manner that a registration mark pattern 1304 may remain in an island shape and an isolating region pattern 1303 may be bounded from a device region pattern 1301, and after development has been effected, the desired pattern can be obtained. Subsequently, when the portion of the silicon substrate exposed in the isolating region 1303 has been engraved up to a depth of about 0.5 to 5 μm by means of dry etching such as, for example, reactive sputter etching carried out within a C Cl$_3$ F atmosphere having a partial pressure of $1 \times 10^{-3}$ to 1 Torr by making use of the above-referred election beam resists 1304 and 1301 as a mask, a structure shown in FIG. 14 can be obtained. In this case, since the electron beam resist pattern 1304 having the shape of the registration mark is isolated from the surrounding resist mask portion 1301 having a large area, even during the sputter etching, deformation of the resist is small, and hence working at a high precision can be achieved. After the resist has been peeled off, an electron beam registration mark according to the present invention, in which desired silicon protrusion registration marks 1504 are isolated from a device forming region 1502 by a recess of silicon 1503 as shown in FIG. 15, can be obtained. According to the above-described process for producing a registration mark, since the device forming region is protected by the resist 1301 during the etching, etching defects would not occur in the device forming region, and this is very desirable for the manufacture of devices in the later stage.

Figure 16:
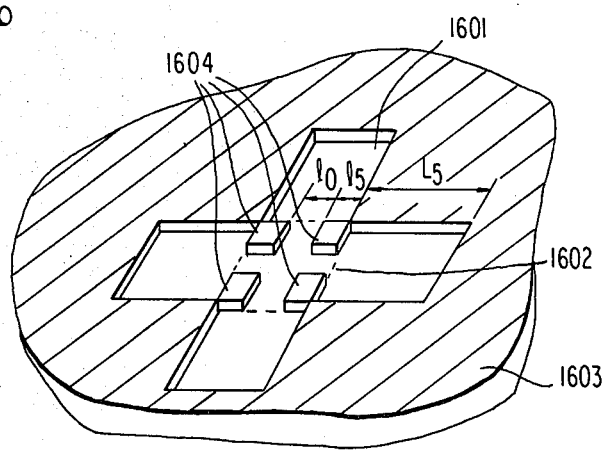
FIG. 16 is a schematic perspective view showing a third embodiment of the present invention.

In FIG. 16 is shown only a neighborhood of a registration mark according to a third embodiment of the present invention in the form of a schematic partial prespective view. In this figure, a region 1602 encircled by a dash line frame within a recess 1601 forming a larger pattern is a region forming a smaller pattern according to the present invention which consists of a group of four protrusions 1604. The step formed between a principal surface 1603 of an object to be exposed and the recess 1601 is preferably selected to be about 0.5 to 5 μm. A length L$_5$ of the cross arm of the larger pattern is preferably selected to be 50 to 150 μm in the case of a wafer mark to be used for correcting an error upon insertion of a wafer into a cassette, and to have a length of about 10 to 50 μm in the case of a chip mark to be used later for correcting an error in position of a chip, although it is not always correct because the arm length is determined according to the requirement that upon scanning of the mark for coarse registration the mark should be always included within the scanning region. A width l$_5$ of the protrusions 1604 forming a smaller pattern for effecting registration at a higher precision (if the protrusions 1604 are used as considering that the recess left between the protrusions 1604 forms the smaller pattern, the width l$_5$ would be the separation between the larger pattern and the smaller pattern) can be selected at such value that upon scanning the registration mark with an electron beam or a laser beam the influence of the wall at the stepped portion may not appear, and favorably it is selected equal to about the sum of the width l$_0$ (normally 1 to 10 μm) of the smaller pattern necessitated for obtaining a sufficient detection signal plus a length of 5 to 10 μm in the case of a wafer mark or 1 to 5 μm in the case of a chip mark.

Figure 17:
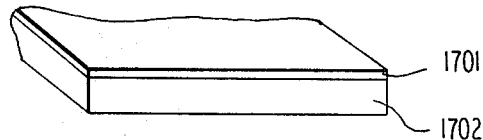
FIGS. 17 to 20 are schematic perspective views showing the successive steps in the process for forming the registration mark according to the third embodiment of the present invention illustrated in FIG. 16.
Figure 18:
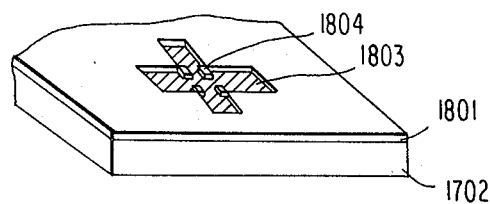
Figure 19:
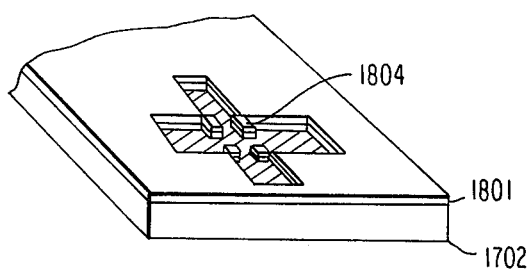
Figure 20:
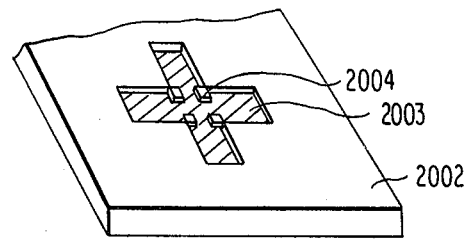

Now description will be made on the process for producing the registration mark according to the third embodiment of the present invention. As shown in FIG. 17, on a silicon substrate 1702 of about 150 to 400 μm in thickness is applied electron beam resist 1701. Subsequently, as shown in FIG. 18, exposure is effected in such manner that a window of a larger pattern 1803 having protrusion pattern 1804 of an island shape left therein to form a smaller pattern may be opened, and after development the desired pattern can be obtained. When a surface portion of the silicon substrate 1702 exposed in the shape of the large pattern has been engraved up to a depth of about 0.5 to 5 μm by means of dry etching such as, for example, reactive sputter etching by making use of the aforementioned electron beam resists 1804 and 1801 as a mask, a structure shown in FIG. 19 can be obtained. In this case, since the electron beam resist pattern 1804 taking the shape of the registration mark makes contact with the surrounding resist mark portion 1801 having a large area only at one point and thus is effectively isolated from the latter, deformation of the resist is small even during the sputter etching, and as highly precise working can be achieved. After the resist has been peeled off, as shown in FIG. 20, on the surface of the silicon substrate 2002 is formed a larger pattern 2003 in the form of a shallow recess, and a smaller pattern is constructed of a combination of four protrusions 2004 left without being removed by the etching (the protrusions themselves could be used as a pattern, or else, the gaps placed between the protrusions which are in a complementary relation to the protrusions could be used as a pattern). The principal surface 2002 of the most part of the silicon substrate and the protrusions 2004 left without being etched are at the same level, and the connecting portions therebetween ideally form point contacts. In practice, however, the finishing of these connecting portions is determined as a composite result of a great many factors such as a degree of defining of the resist pattern 1804, a degree of removal by etching of the recess 2003, and even the adaptability of the properties of the resist itself and the exposure conditions, and hence, by monitoring the extent of separation or the extent of connection therebetween, extremely useful data for controlling these factors can be obtained. Therefore, the registration pattern according to the third embodiment additionally has such important supplementary effects.

Figure 21:
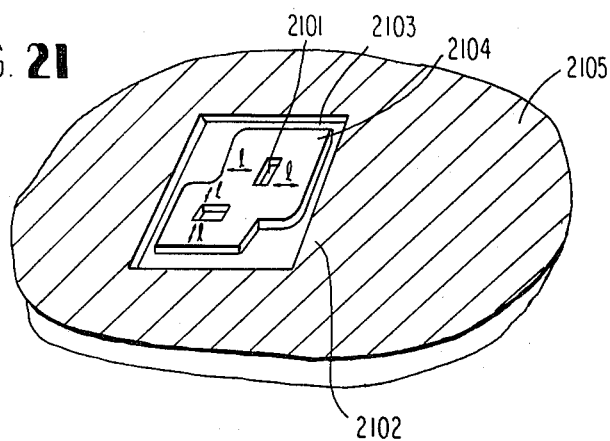
FIG. 21 is a schematic perspective view showing a fourth embodiment of the present invention.

In FIG. 21 is shown a registration mark according to a fourth embodiment of the present invention in the form of a schematic partial perspective view. With reference to FIG. 21, in a semiconductor substrate 2105 a groove type of registration marks 2101 are formed as engaved in a mesa type silicon region 2104 isolated from a device forming region 2102 by a peripheral groove 2103 of 0.5 to 5 µm in depth. A distance 1 between the silicon groove 2103 surrounding the isolated region 2104 and the registration mark 2101 is suitably selected to be the same extent as the distance in the case of the protrusion type of registration marks.

Figure 22:
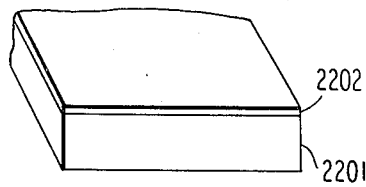
FIGS. 22 to 25 are schematic perspective views showing the successive steps in the process for forming the registration mark according to the fourth embodiment of the present invention illustrated in FIG. 21.
Figure 24:
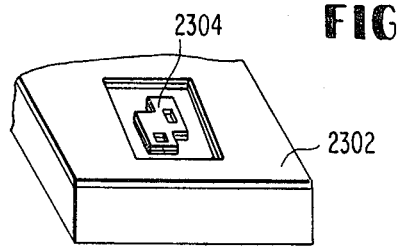
Figure 23:
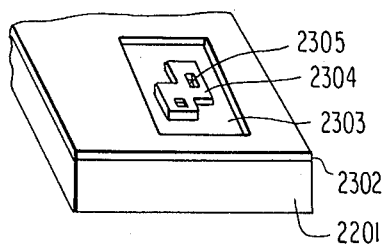
Figure 25:
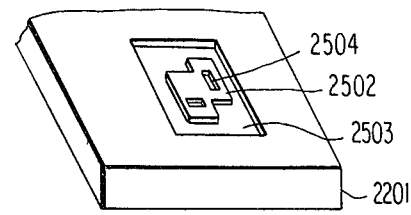

Now decription will be made on the process for producing the registration mark according to the fourth embodiment illustrated in FIG. 21. As shown in FIG. 22, on a silicon substrate 2201 having a thickness of about 150 to 400 µm is applied electron beam resist 2202. Subsequently, as shown in FIG. 23, the portions to be the registration mark patterns 2305 and the silicon groove pattern 2303 are exposed to an electron beam and then developed. In this embodiment, since the size of the mesa type region pattern 2304 is proportional to a predictive precision of the mark position and often it becomes larger than the size of the previously described registration mark of an island shape, and so, the influence of deformation of the resist is liable to become somewhat larger. Thereafter, when the silicon substrate has been engraved up to a depth of about 0.5 to 5 µm by means of dry etching such as, for example, reactive sputter etching effected within a C Cl$_3$ F atmosphere having a partial pressure of $1 \times 10^{-3}$ to 1 Torr by making use of the resist pattern 2302, 2304 formed at a high precision through the electron beam exposure, as a mask, a structure shown in FIG. 24 can be obtained. After the resist has been peeled off, a resistration mark as shown in FIG. 25 is obtained, in which desired groove type registration marks 2504 are formed in a silicon mesa type region 2502 surrounded by a silicon groove 2503 of a closed loop shape.

Even if a part of the above-described process for producing a registration mark is changed, obviously a registration mark having a similarly high precision can be formed, so far as the registration mark pattern according to the present invention in which the resist area surrounding the registration mark is minimized, is employed.

While the present invention has been described above in connection to its preferred embodiments aiming at manufacture of semiconductor devices such as LSI's or the like, of course, the present invention is applicable to other semiconductor substrates, and the application of the invention is far more broad without necessitating to limit it to any particular objects to be exposed. In addition, if the registration pattern according to the present invention is used in the case where a coarse registration step must be provided preliminarily because of the fact that an extremely high precision is required in the final registration or in the case where two kinds of registration marks are provided as superposed on each other in order to jointly employ two different exposure processes, then the working precision of a smaller pattern is incomparably improved as compared to that in the prior art.

What is claimed is:

1. A semiconductor device comprising a semiconductor substrate, a device region formed along a major surface of said semiconductor substrate, and a chip registration mark formed along said major surface and positioned in a peripheral portion adjacent to said device region, said chip registration mark including a first registration pattern having a recess shape and a second registration pattern having a protrusion shape disposed within said first registration pattern, said first and second registration patterns having straight edge lines, respectively, and said first and second registration patterns jointly forming a composite registration mark.

2. A semiconductor wafer comprising a semiconductor substrate, a plurality of semiconductor devices formed along a major surface of said semiconductor substrate in matrix form, and a wafer registration mark formed along said major surface and positioned in a peripheral portion thereof adjacent said matrix of semiconductor devices, said wafer registration mark including first and second registration patterns forming a composite registration mark, said first registration pattern having a recess shape and having at least one straight edge line, and said second registration pattern having a protrusion shape, being disposed within said first registration pattern, and having at least one straight edge line.

3. A registration mark for use in an exposure technique for micro-fine working, comprising two kinds of larger and smaller registration patterns on a substrate and superposed on each other, said larger pattern being a recess formed on the surface of said substrate and said smaller pattern being a protrusion formed at a partial region within said recess.

4. A registration mark for electron beam exposure, comprising: a semiconductor region formed in a substrate and surrounded by a silicon-removed section so as to isolate said region from adjacent regions which form a main body of a device.

5. A registration mark for electron beam exposure as claimed in claim 4, in which said silicon-removed section forms a first registration pattern, and said region surrounded by said silicon-removed section forms a second registration pattern.

6. A registration mark for electron beam exposure as claimed in claim 4, in which a groove provided within said region surrounded by said silicon-removed section forms a registration pattern.

7. A registration mark formed in a semiconductor substrate for use in an exposure technique for micro-fine working comprising:
   a first registration pattern defined by a recess formed in said semiconductor substrate, and
   a second registration pattern defined by an upstanding protrusion formed within said recess.

8. A registration mark as claimed in claim 7, wherein said first and second registration patterns have a common reference point.

9. A registration mark as claimed in claim 8, wherein said recess (503) and protrusion (501) are symmetrical and are each formed in the shape of a cross.

10. A registration mark as claimed in claim 7, wherein said protrusion comprises a plurality of islands.

11. A registration mark as claimed in claim 10, wherein said recess is formed in a rectangular shape.

12. A registration mark as claimed in claim 10, wherein said recess is formed in a cross shape.

13. A registration mark as claimed in claim 12, wherein said islands are disposed at intersections of arms of said cross shape.

14. A registration mark as claimed in claim 7, wherein a groove is defined within said protrusion.

15. A registration mark as claimed in claim 7, wherein said first registration mark is for use in coarse positioning of said semiconductor substrate and said second registration mark is for use in fine positioning.

16. A registration mark as claimed in claim 7, wherein said first registration mark is for use with optical exposure.

17. A registration mark as claimed in claim 16, wherein said second registration mark is for use with electron beam exposure.

18. A semiconductor wafer comprising:
   a semiconductor substrate;
   a plurality of device regions formed along a major surface of said semiconductor substrate in matrix form; and
   a plurality of registration marks each including a protrusion within a recess formed in said major surface of said semiconductor substrate, said registration marks being arranged at positions surrounding each of said device regions and at positions surrounding a group of said plurality of device regions.

19. A semiconductor wafer as claimed in claim 18, wherein said positions surrounding each of said device regions are located along two crossed, perpendicular axes of symmetry of each of said device regions, and said positions surrounding a group of said plurality of device regions are located along two crossed, perpendicular axes of symmetry of said group.

* * * * *

UNITED STATES PATENT AND TRADEMARK OFFICE
CERTIFICATE OF CORRECTION

PATENT NO. : 4,356,223
DATED : October 26, 1982
INVENTOR(S) : Yasuo IIDA et al

It is certified that error appears in the above—identified patent and that said Letters Patent is hereby corrected as shown below:

Column 2, line 52, after "continuous", change "are" to -- area --

Column 3, line 63 and line 64, each occurrence, change "forms" to -- form --;

Column 3, line 65, change "pattern" to -- patterns --.

Signed and Sealed this

*Eleventh* Day of *January 1983*

[SEAL]

Attest:

GERALD J. MOSSINGHOFF

*Attesting Officer*  *Commissioner of Patents and Trademarks*